(12) United States Patent
Hosier et al.

(10) Patent No.: US 6,927,381 B2
(45) Date of Patent: Aug. 9, 2005

(54) PHOTOSENSITIVE IMAGING APPARATUS SENSITIVE TO ORANGE LIGHT

(75) Inventors: Paul A. Hosier, Rochester, NY (US); Jagdish C. Tandon, Fairport, NY (US); Josef E. Jedlicka, Rochester, NY (US); Gaurav Sharma, Webster, NY (US); Alain E. Perregaux, Rochester, NY (US); Robert P. Herloski, Webster, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/656,622

(22) Filed: Sep. 5, 2003

(65) Prior Publication Data

US 2004/0046105 A1 Mar. 11, 2004

Related U.S. Application Data

(62) Division of application No. 09/841,279, filed on Apr. 24, 2001, now Pat. No. 6,646,248.

(51) Int. Cl.[7] ............................................. H01L 27/00
(52) U.S. Cl. ................................................ 250/208.1
(58) Field of Search ...................... 250/208.1–208.6, 250/201.1–203.7, 227.11–227.32; 356/326; 345/87, 88, 22, 150, 151; 348/808, 741, 776, 809

(56) References Cited

U.S. PATENT DOCUMENTS

| | | | | |
|---|---|---|---|---|
| 3,981,561 A | * | 9/1976 | Weiss et al. | 359/243 |
| 4,870,496 A | | 9/1989 | Fantone | 358/225 |
| 5,036,203 A | * | 7/1991 | Solomon | 250/370.06 |
| 5,148,268 A | | 9/1992 | Tandon et al. | 358/41 |
| 5,543,838 A | | 8/1996 | Hosier et al. | 348/311 |
| 5,801,829 A | * | 9/1998 | Mueller et al. | 356/326 |
| 5,914,749 A | | 6/1999 | Bawolek et al. | 348/273 |
| 6,201,293 B1 | | 3/2001 | Ormond et al. | 257/667 |

FOREIGN PATENT DOCUMENTS

WO    WO 91/13942    9/1991

* cited by examiner

*Primary Examiner*—Tu T. Nguyen
(74) *Attorney, Agent, or Firm*—R. Hutter

(57) ABSTRACT

A photosensitive imaging device for recording images across the entire visible spectrum includes a set of photosensors which have a peak response around the orange part of the spectrum, about 600 nm. The peak response is obtained by combining responses of, in one case, photosensors associated with a filter which admits red or infrared wavelengths and longer and photosensors associated with a filter which admits orange wavelengths and longer. In another case, the photosensor is structured to attenuate longer wavelengths, which, in combination with a filter which admits orange and longer wavelengths, can simulate a peak behavior around the orange part of the spectrum.

8 Claims, 6 Drawing Sheets

PHOTOSENSITIVE IMAGING APPARATUS SENSITIVE TO ORANGE LIGHT

CROSS-REFERENCE TO RELATED APPLICATIONS

This is a divisional of U.S. application Ser. No. 09/841,279 filed Apr. 24, 2001 now U.S. Pat. No. 6,646,248 by the same inventors, and claims priority therefrom.

INCORPORATION BY REFERENCE

The following U.S. patents, all assigned to the assignee hereof, are hereby incorporated by reference for their teachings relating to the structure and operation of full-color photosensitive devices such as used in office equipment and digital cameras: U.S. Pat. Nos. 5,148,268 and 5,543,838.

TECHNICAL FIELD

The present invention relates to color photosensitive devices, such as used in image input scanners and digital cameras, wherein light from an image received by the device is converted to a set of image signals.

BACKGROUND

Monochrome image sensor arrays typically comprise a linear array of photosensors which raster scan an image bearing document and convert the reflected light from each microscopic image area viewed by each photosensor over time to image signal charges. Following an integration period, the image signals are amplified and transferred to a common output line or bus through successively actuating multiplexing transistors.

In a well-known design of a photosensitive device such as used in an image input scanner, separate linear arrays of photosensors are arranged in parallel on a single sensor bar, and caused to move in a scan direction relative to the original image generally perpendicular to the direction of the arrays. The photosensors in each array are provided with a filter thereon of one primary color. As the sensor bar including the three rows of photosensors moves along the original image, each portion of the area of the original image is exposed to each of the rows of photosensors. As each filtered row of photosensors moves past each particular area in the original image, signals according to the different primary color separations of that area are output by the particular photosensors in each row. In this way, three separate sets of signals, each relating to one primary color, will be produced by the linear arrays of photosensors.

In the general art of imaging, including the art of television and photographic film, it is known that the color-sensitive photoreceptors in the human eye tend to have gaussian responses which peak respectively at approximately in the blue, green, and orange parts of the spectrum, as opposed to the blue, green, and red parts to which electronic devices are typically sensitive. It would thus be desirable to have an imaging apparatus or film with a responsivity which "peaks" at orange (about 600 nm) rather than red (about 550 nm). Achieving this orange sensitivity has proven to be difficult. Light-transmissive filters which have a gaussian peak of admitting light at 600 nm exist, but tend to be difficult or expensive to manufacture.

The present invention is directed to techniques for designing a photosensitive imaging device wherein at least one set of photosensors is particularly sensitive (that is, has a response that substantially peaks) in the orange (approximately 600 nm) part of the visible spectrum.

PRIOR ART

U.S. Pat. Nos. 5,148,268 and 5,543,838, incorporated by reference above, disclose circuit designs for color image sensor arrays for recording full-color original images as digital data.

U.S. Pat. No. 4,870,496 discloses a video camera in which a yellow-orange filter and an infrared filter are used in combination; however, the reference does not disclose isolating the orange portion of the visible spectrum.

U.S. Pat. No. 5,914,749 discloses a color imaging device in which individual photosensors in an array are filtered to receive magenta, white, or yellow portions of the visible spectrum. The outputs from the various types of photosensors are subjected to mathematical algorithms to infer other primary colors in the image being recorded.

U.S. Pat. No. 6,201,293 is cited as a teaching of the general technique of placing light-transmissive filters over various photosensors in a silicon chip.

PCT Patent Application WO 91/13942 discloses a material suitable for an orange band-pass optical filter.

SUMMARY

According to one aspect of the present invention, there is provided an imaging apparatus, comprising a first set of photosensors, for recording light of a substantially red wavelength and longer wavelengths, and a second set of photosensors, for recording light of a substantially infrared wavelength and longer wavelengths. Means are provided for subtracting signals from the second set of photosensors from signals from the first set of photosensors, thereby yielding difference signals substantially related to light of substantially orange wavelengths.

According to another aspect of the present invention, there is provided an imaging apparatus, comprising a first set of photosensors, having associated therewith a light-transmissive filter for admitting light of a substantially orange wavelength and longer wavelengths. The first set of photosensors has an epitaxial layer configured to have a decreasing response with increasing wavelengths of incident light over 600 nm.

According to another aspect of the present invention, there is provided an imaging apparatus, comprising a first set of photosensors, a first light-transmissive filter for admitting light of orange and longer wavelengths to the first set of photosensors and an infrared filter for blocking light of a substantially orange wavelength and higher wavelengths to the first set of photosensors.

According to another aspect of the present invention, there is provided an imaging apparatus, comprising a first set of photosensors, a first light-transmissive filter for admitting light of a substantially orange wavelength and longer wavelengths to the first set of photosensors, and a light source, for emitting light which is reflected by an image to be recorded. The light source has an emission spectrum which is attenuated in the infrared range.

DETAILED DESCRIPTION

Figure 1:
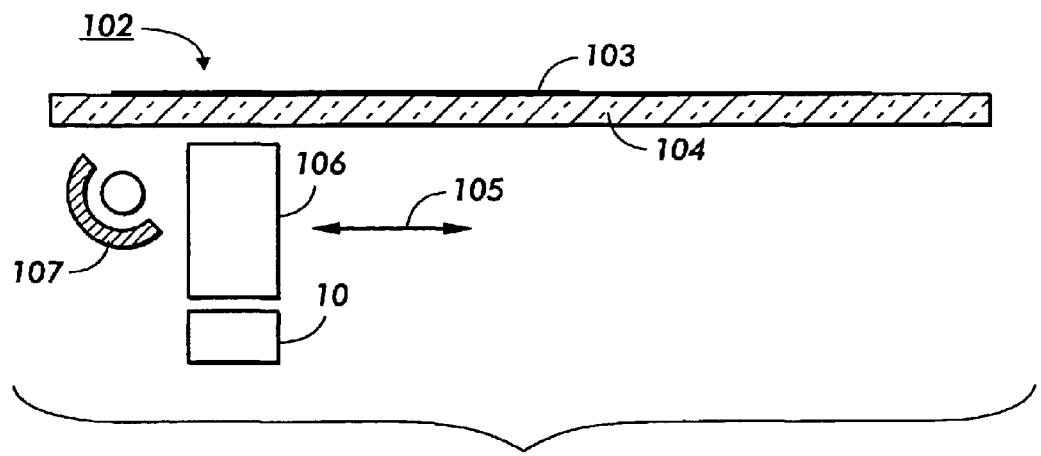
FIG. 1 is an elevational view showing the essential elements of a raster input scanner using the present invention.

Referring to FIG. 1, there is shown an exemplary raster input scanner, designated generally by the numeral 102, of the type adapted to use a scanning array, or sensor bar, 10. Sensor bar 10 comprises a linear full width array having a scan width substantially equal to or slightly greater than the width of the largest document 103 or other object to be scanned. Documents to be scanned are supported on a generally rectangular transparent platen 104, typically glass, sized to accommodate the largest original document 103 to be scanned. A document 103 to be scanned is located either manually or by a suitable automatic document handler or feeder (not shown) on platen 104 for scanning. Array 10 is supported for reciprocating scanning movement in the scan direction depicted by arrows 105 below platen 104 by a movable scanning carriage (not shown). A lens 106 focuses array 10 on a line like area extending across the width of platen 104. One or more lamp and reflector assemblies forming a light source 107 are provided for illuminating the line-like area on which array 10 is focused.

Figure 2:
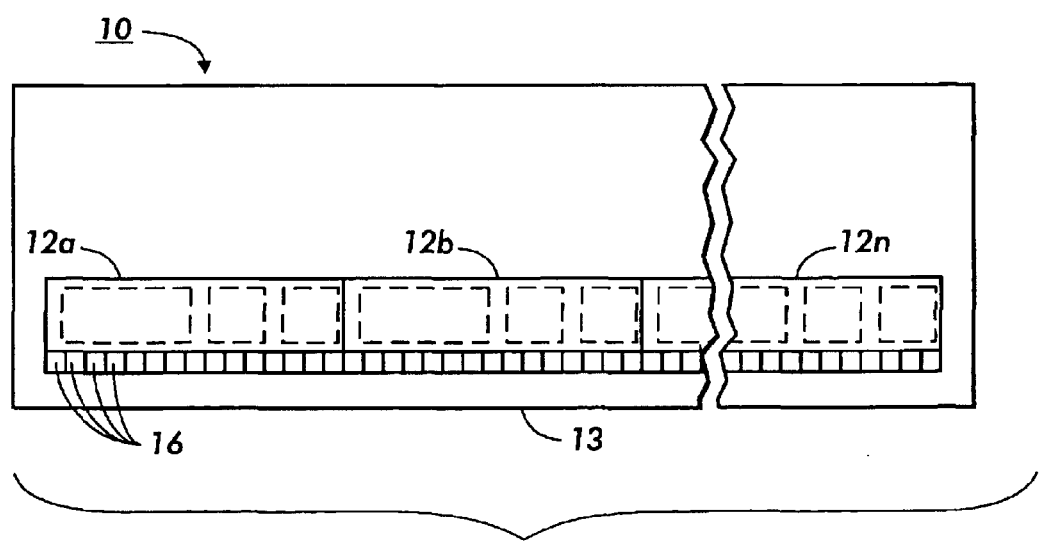
FIG. 2 is a plan view showing a number of photosensitive chips as could be used in the scanner of FIG. 1.

Referring to FIG. 2, there is shown a long or full width sensor bar 10 composed of a plurality of smaller sensor chips 12 assembled together end-to-end (specific chips are identified by numerals 12a, 12b, . . . 12n) on an elongated generally rectangular rigid substrate 13.

Chips 12, which may, for example, be charge coupled devices (CCDs) or MOS sensor arrays, are relatively thin silicon dies having a generally rectangular shape. A set 16 of photosensor areas parallel the longitudinal axis of the chips. Other active elements such as shift registers, gates, pixel clock, etc., are preferably formed integrally with chips 12. Suitable external connectors (not shown) are provided for electrically coupling the chips 12 to related external circuitry.

As is well known in the art of designing full-color imaging devices, there is typically provided in a set 16 of photosensor areas different subsets of photosensors, each set being sensitive, by means of a light-transmissive color filter thereon, to one primary color. In a common design, different sets of photosensors are filtered to respond to blue, green, and red light. The outputs of the differently-filtered photosensors are then coordinated by downstream circuitry to realize a full-color image.

Figure 3:
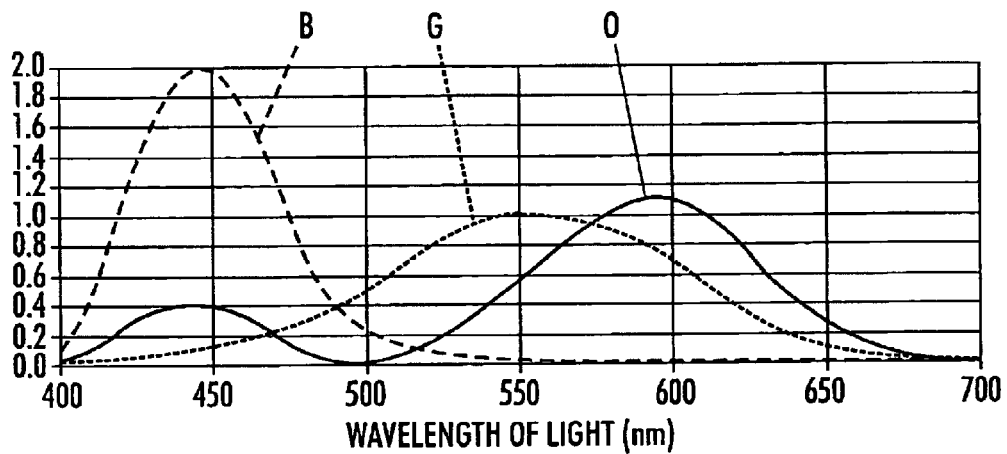
FIG. 3 is a graph showing the relative response of different types of "cones" (color-sensitive photoreceptor cells) in the retina of the human eye.

FIG. 3 is a graph showing the relative response of different types of "cones" (color-sensitive photoreceptor cells) in the retina of the human eye. In the human eye there are three types of cones, each cone being sensitive to one portion of the visible spectrum; more precisely, each type of cone has a largely gaussian response curve which peaks at, respectively, the points along the visible spectrum which are perceived by the brain as blue (B), green (G) and orange (O). It would be desirable to provide an imaging apparatus in which the filtering of the three types of photosensor correspond to the response of the three types of cone in the human eye.

Figure 4:
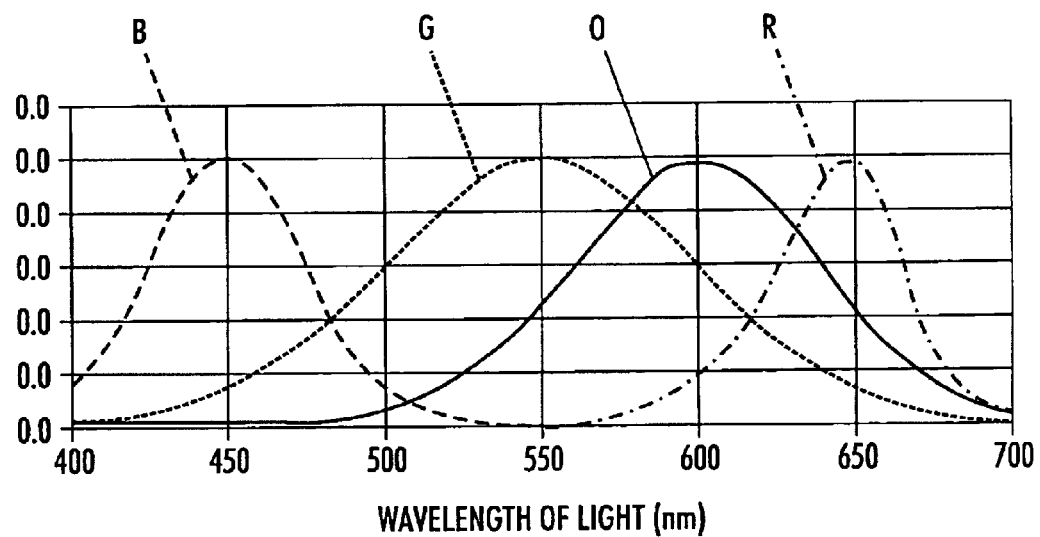
FIG. 4 is a graph showing the relative response of different types of primary-color filtered photosensors in an "ideal" sensor which emulates the human eye.

FIG. 4 is a diagram generally similar to FIG. 3, illustrating the technical challenge of providing an imaging apparatus which thus simulates the response of the human eye. While filter materials exist which admit the primary colors blue (B) and green (G) in a reasonable approximation of the largely gaussian functions of the cones in the human eye, most known imaging devices have included red (R) filters, which peak in the red portion of the visible spectrum, at about 650 nm. It would be desirable, however, from the standpoint of emulating the human eye, to filter one set of photosensors with orange light, that is in a largely gaussian function which peaks at about 600 nm, as shown by (O) in the graph. While such orange band-pass optical filters exist, they have proven to be unsatisfactory for various reasons. The present invention is directed to various techniques for simulating this desired orange response, without use of such a filter.

In the following descriptions of FIGS. 5–8, each Figure illustrates the light-transmissivity functions of a number of filters associated with photosensors in a device such as shown as chips 12 in FIG. 2. In each embodiment, there is provided separate filters for photosensor sets intended to detect blue (B) and green (G) light. Another set of photosensors is intended, according to the invention, to detect light according to a function which peaks substantially in the orange portion of the visible spectrum, according to various strategies as will be described in detail below. The basic architecture of a photosensor chip having three differently-filtered rows of photosensors in given, for instance, in U.S. Pat. No. 6,201,293.

Figure 5:
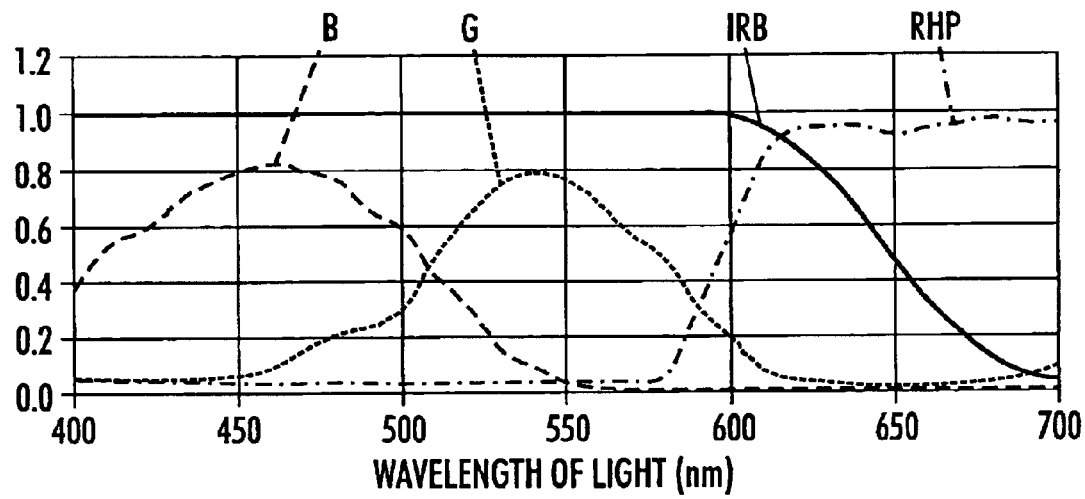
FIGS. 5–8 are a series of graphs showing the response effects of different filtering configurations on photosensors in a scanner, according to various embodiments of the present invention.

FIG. 5 is a graph illustrating one such technique according to the present invention. In addition to the filters for B and G as shown for some photosensors, others of the photosensors in the apparatus are provided with a "red-high-pass" (RHP) filter, causing the photosensors to have the response as shown (in the present description, "high-pass" refers to longer wavelength, not higher frequency). In the illustrated embodiment, In addition to the RHP filter, the photosensors in question (and, indeed, all of the photosensors on the device) are provided with an infrared blocking filter, which has the characteristics shown as IRB. Such infrared blocking filters are indeed common in the form of a "cover glass" which covers the whole device, including the RHP filter on a particular set of photosensors. In the illustrated embodiment, the RHP filter reaches an upper plateau of effectively maximum transparency at about 620 nm, while the IRB filter is effectively transparent up to 600 nm. The combination of the RHP and IRB functions, applied to a single set of photosensors, can yield a response generally approximating the pure orange filter O in FIG. 4.

Another technique to obtain a similar result as use of the infrared blocking filter is to design a light source, such as indicated as 107 in FIG. 1, which emits light which is attenuated with respect to infrared light: in other words, the properties of the light source 107 can simulate the behavior of an infrared blocking filter.

Figure 6:
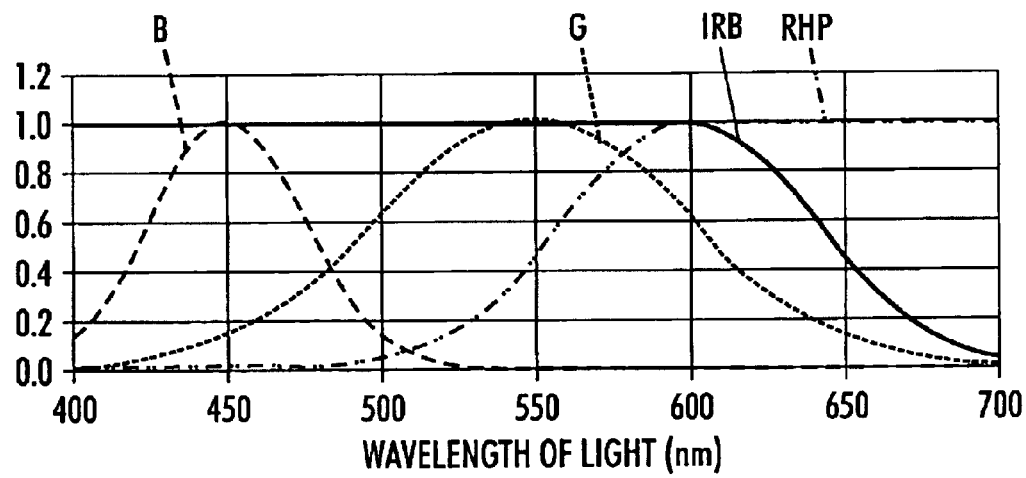

FIG. 6 is a diagram showing another embodiment of the present invention. Instead of a red high-pass filter as shown in FIG. 5, there is used an orange high-pass (OHP) filter. (Materials for both the RHP and OHP filters are commercially available.) Here, the OHP filter has a plateau of full transparency at 600 nm and longer wavelengths, while the IRB is fully transparent up to 600 nm. This arrangement can provide a combination function which peaks, as shown, at about 600 nm, a better approximation of a pure orange band-pass filter.

Figure 7:
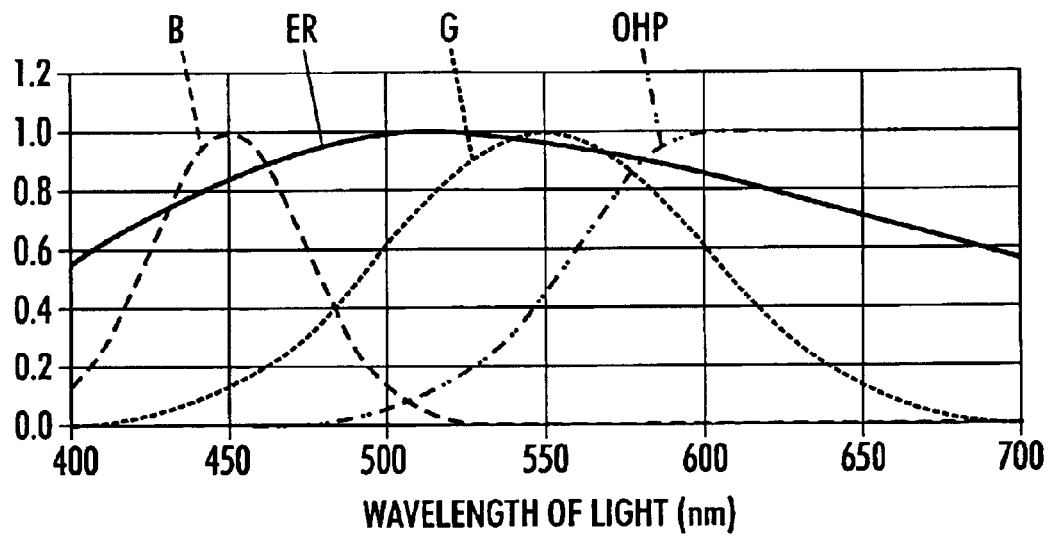

FIG. 7 is a diagram showing another embodiment of the present invention. As in the FIG. 6 embodiment, a set of photosensors is provided with an orange high-pass (OHP) filter. The OHP filter provides one boundary, as shown, for defining the response up to about the 600 nm mark. For progressively attenuating signals above the 600 nm mark, and thus yielding a response peak at about 600 nm or slightly shorter wavelengths, the embodiment provides for a CMOS photosensor (of a type well-known in the art) having an epitaxial layer (i.e., where charges are generated in response to incident light) having a structure configured to have a decreasing response with increasing wavelengths of incident light over 600 nm. Specifically, according to one embodiment, this epitaxial layer should be of a thickness of approximately 2 μm; such a thickness yields the response above 600 nm shown. The epitaxial layer can be provided not only on photosensors provided with the OHP filter, but on all photosensors as well.

Figure 8:
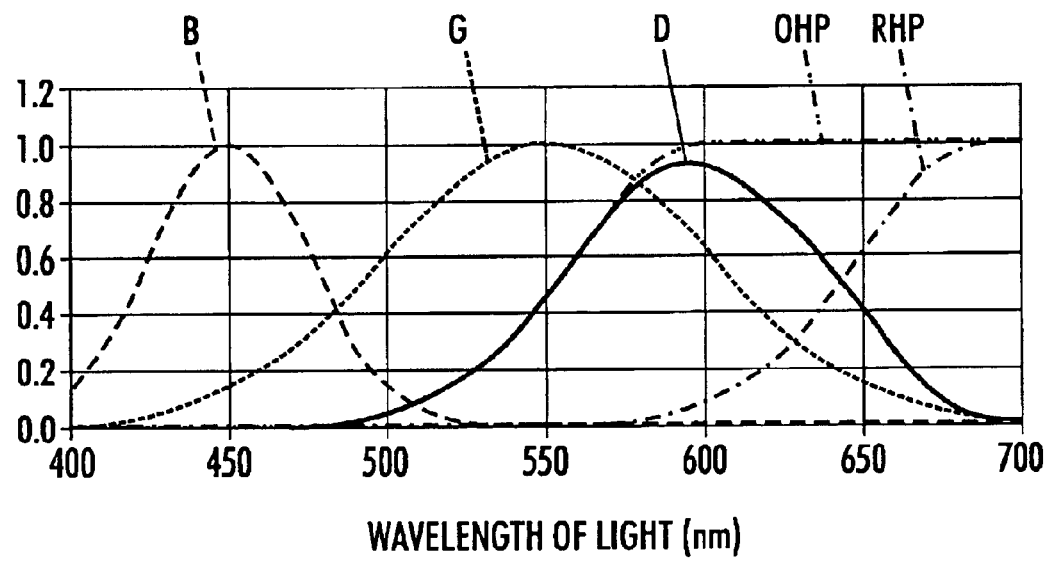

FIG. 8 is a diagram showing another embodiment of the present invention. In this case, in addition to photosensors being filtered to accept blue and green (i.e., primary colors) light, one set of photosensors is effectively provided with an orange high-pass (OHP) filter, which has a plateau of transparency at 600 nm in this embodiment, and another set of photosensors is provided with a red high-pass (RHP) filter, having a plateau at about 690 nm, as shown. Also shown in the diagram is a line, marked D, representative of the difference in responses OHP–RHP. This difference function, it can be seen, is largely similar to the ideal orange response in the FIG. 4 graph, in this embodiment peaking at just under 600 nm. Thus, according to this embodiment, signals from an RHP-filtered photosensor are subtracted from the signals from an OHP-filtered photosensor when the two photosensors are "looking at" approximately the same small area in an image being recorded, and this difference signal will correspond to the "orange" component of the image, much as if a simple orange band-pass filter were present.

Figure 9:
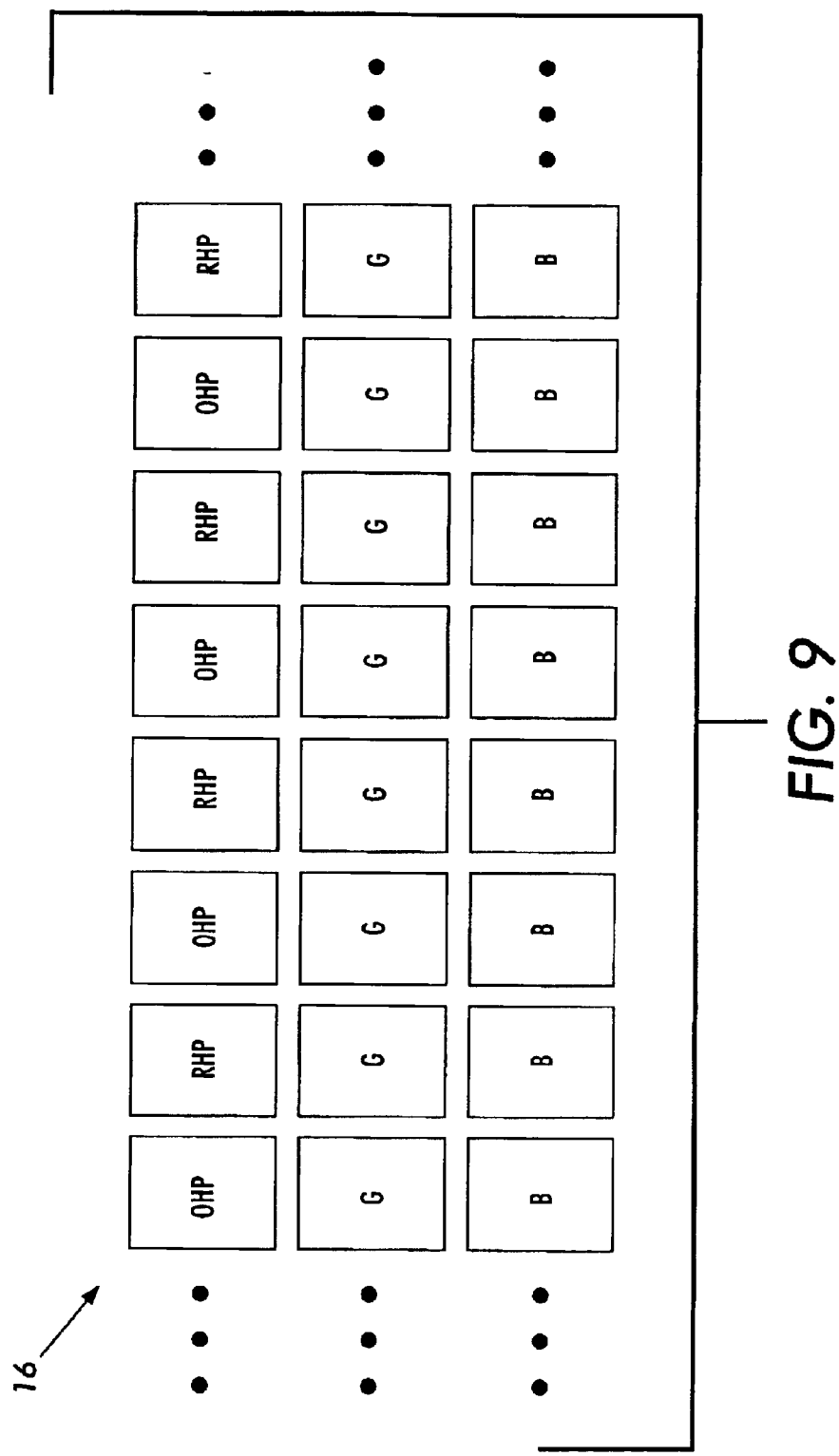
FIGS. 9–10 are a plan view, showing a possible arrangement of photosensor filters according to one embodiment of the present invention.
Figure 10:
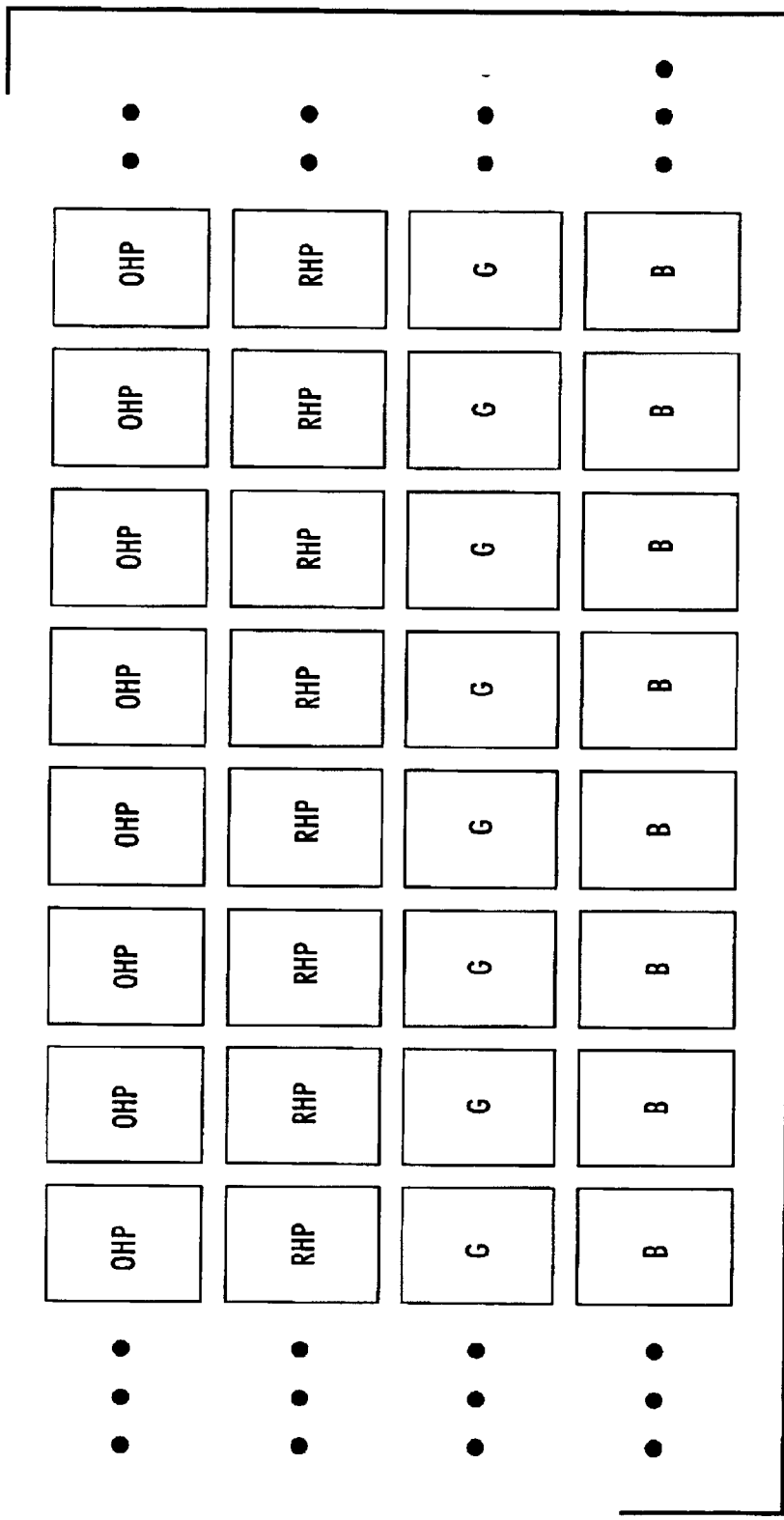

FIG. 9 is a plan view showing a possible arrangement of photosensors 16 according to the FIG. 8 aspect of the present invention (what is shown is a small portion of a larger array on a chip such as 12 in FIG. 2). There are provided three rows (linear arrays) of photosensors, one row being filtered blue (B), and another filtered green (G). The third row is filtered with alternating red high pass (RHP) and orange high pass (OHP) filters. (More broadly, it can be said that the OHP filtered and RHP filtered photosensors are commingled within an array; for example, there may be one OHP photosensor interspaced between groups of two or three RHP photosensors, or some other arrangement besides one-by-one alternation.)

In order to obtain the combination response of FIG. 8 above, the resulting signals from the differently-filtered photosensors can be effectively combined through downstream circuitry, by in effect subtracting the IRB signal from the RHP signal from a neighboring photosensor. This subtraction of signals (by subtraction means, not shown) can be done by, for instance, feeding outputs from neighboring filtered photosensors into analog circuitry which effects the subtraction in signals, or by subsequent digital image processing. Given the typical scale of photosensors relative to images being recorded in office equipment, it is largely immaterial that the RHP and OHP photosensors in each neighboring pair "look at" slightly different small areas in the original image.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A photosensitive imaging apparatus, comprising:
   a first set of photosensors;
   a first light-transmissive filter for admitting light of orange and longer wavelengths to the first set of photosensors; and
   an infrared filter for blocking light of a substantially orange wavelength and longer wavelengths to the first set of photosensors.

2. The apparatus of claim 1, the first filter having a plateau of effective transparency at about 620 nm and longer wavelengths.

3. The apparatus of claim 1, the first filter being substantially opaque for about 575 nm and shorter wavelengths.

4. The apparatus of claim 1, the first filter and the infrared filter having a combined response which peaks at about 620 nm.

5. The apparatus of claim 1, further comprising a second set of photosensors, having associated therewith a second light-transmissive filter for admitting light of a second primary color.

6. The apparatus of claim 5, further comprising a third set of photosensors, having associated therewith a third light-transmissive filter for admitting light of a third primary color.

7. The apparatus of claim 6, wherein the second primary color is substantially green, and the third primary color is substantially blue.

8. The apparatus of claim 6, wherein the infrared filter is disposed over the second set of photosensors and the third set of photosensors.

* * * * *